(12) United States Patent
Akamatsu et al.

(10) Patent No.: US 6,608,381 B1
(45) Date of Patent: Aug. 19, 2003

(54) INTEGRATED ELECTRONIC DEVICE HAVING FLIP-CHIP CONNECTION WITH CIRCUIT BOARD AND FABRICATION METHOD THEREOF

(75) Inventors: Toshiya Akamatsu, Kawasaki (JP); Kazuaki Karasawa, Kawasaki (JP); Teru Nakanishi, Kawasaki (JP); Kozo Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 26 days.

(21) Appl. No.: 09/609,652

(22) Filed: Jul. 3, 2000

Related U.S. Application Data (62) Division of application No. 09/392,722, filed on Sep. 9, 1999, which is a division of application No. 08/769,529, filed on Dec. 19, 1996, now Pat. No. 5,977,637, which is a division of application No. 08/504,080, filed on Jul. 19, 1995, now Pat. No. 5,611,481.

(30) Foreign Application Priority Data

Jul. 20, 1994 (JP) ............................................. 6-168385

(51) Int. Cl.⁷ .......................... H01L 23/48; H01L 23/52; H01L 29/40
(52) U.S. Cl. ....................................... 257/737; 257/738
(58) Field of Search ................................. 438/611, 612, 438/613, 614, 615, 616, 617, FOR 343; 257/737, 738; 228/180, 22

(56) References Cited

U.S. PATENT DOCUMENTS

| | | | |
|---|---|---|---|
| 5,007,163 A | | 4/1991 | Pope et al. |
| 5,038,996 A | * | 8/1991 | Wilcox et al. |
| 5,116,228 A | * | 5/1992 | Kabeshita et al. |
| 5,186,381 A | * | 2/1993 | Kim |
| 5,376,584 A | | 12/1994 | Agarwala |
| 5,391,514 A | | 2/1995 | Gall et al. |
| 5,859,470 A | | 1/1999 | Ellerson et al. |

FOREIGN PATENT DOCUMENTS

| | | |
|---|---|---|
| JP | 64-28931 | 1/1989 |
| JP | 306634 | 12/1998 |

OTHER PUBLICATIONS

Zegun Mei, *Low Temperature Solders*, Hewlett–Packard Journal; p. 91, Aug. 1996.

IBM Technical Disclosure Bulletin, vol. 32, No. 4A, Sep. 1989, p. 273–274.

\* cited by examiner

*Primary Examiner*—David E. Graybill
(74) *Attorney, Agent, or Firm*—Armstrong, Westerman & Hattori, LLP (57) ABSTRACT

An integrated electronic device having an electric connection between a first electrode of a semiconductor chip and a second electrode of a circuit board. One embodiment according to the present invention is a method for fabricating an integrated electronic device having an electric connection between a first electrode of a semiconductor chip and a second electrode of a circuit board, both surfaces of the first and second electrodes having an adhesive tendency to molten metal, the method comprising the steps of forming a metal bump on the first electrode, the metal bump being made of a soldering metal alloy consisting of a solid phase component and a liquid phase component at an operating temperature; and forming an electric connection between the first electrode and the second electrode by heating the soldering metal alloy so as to adhere to the surface of the second electrode.

9 Claims, 6 Drawing Sheets

| FIRST BUMP | SECOND BUMP | CONNECTION TEMPERATURE |
|---|---|---|
| Sn | In | 130°C |
| Sn | Bi | 170°C |
| Sn | Pb | 210°C |
| In | Sn | 130°C |
| In | Bi | 100°C |
| Bi | Sn | 170°C |
| Bi | In | 100°C |
| Pb | Sn | 210°C |

TABLE 1

| FIRST BUMP | SECOND BUMP | CONNECTION TEMPERATURE |
|---|---|---|
| Sn | In | 130°C |
| Sn | Bi | 170°C |
| Sn | Pb | 210°C |
| In | Sn | 130°C |
| In | Bi | 100°C |
| Bi | Sn | 170°C |
| Bi | In | 100°C |
| Pb | Sn | 210°C |

TABLE I

INTEGRATED ELECTRONIC DEVICE HAVING FLIP-CHIP CONNECTION WITH CIRCUIT BOARD AND FABRICATION METHOD THEREOF

This application is a division of prior application Ser. No. 09/392,722, filed Sep. 9, 1999, which is a division of application Ser. No. 08/769,529, filed Dec. 19, 1996, U.S. Pat. No. 5,977,637, which is a division of application Ser. No. 08/504,080, filed Jul. 19, 1995, U.S. Pat. No. 5,611,481.

FIELD OF INVENTION

The present invention relates to an integrated electronic device and a fabrication method thereof, more particularly to the integrated electronic device having an electric connection for connecting a semiconductor chip with a circuit board and fabrication method thereof.

DESCRIPTION OF THE PRIOR ART

Figure 7:
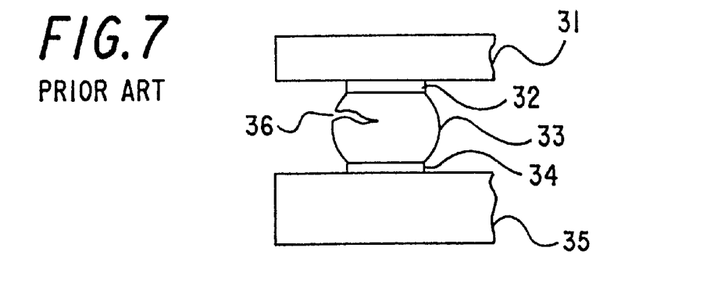
FIG. 7 is a diagrammatic section view of a rigid soldering metal connection having a crack between a chip and a circuit board in the prior art.
Figure 8A:
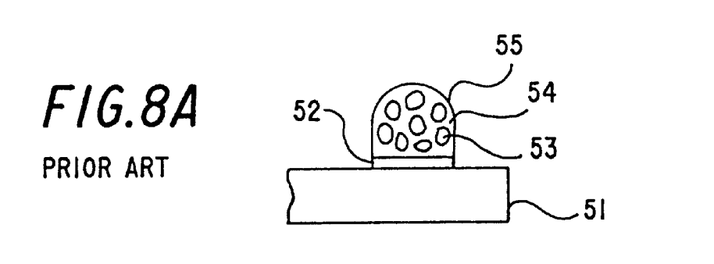
FIG. 8A is a diagrammatic section view of a bump containing dispersed liquid metal particles of gallium-indium in a flux vehicle for a liquid metal connection on a gold electrode in the prior art.
Figure 8B:
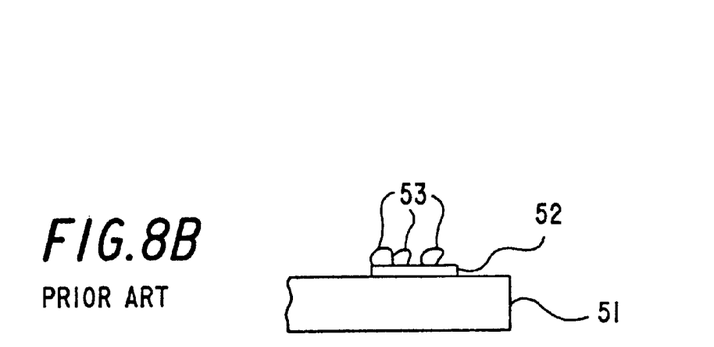
FIG. 8B is a diagrammatic section view of liquid metal droplets left on the gold electrode after heating process in the prior art.
Figure 9:
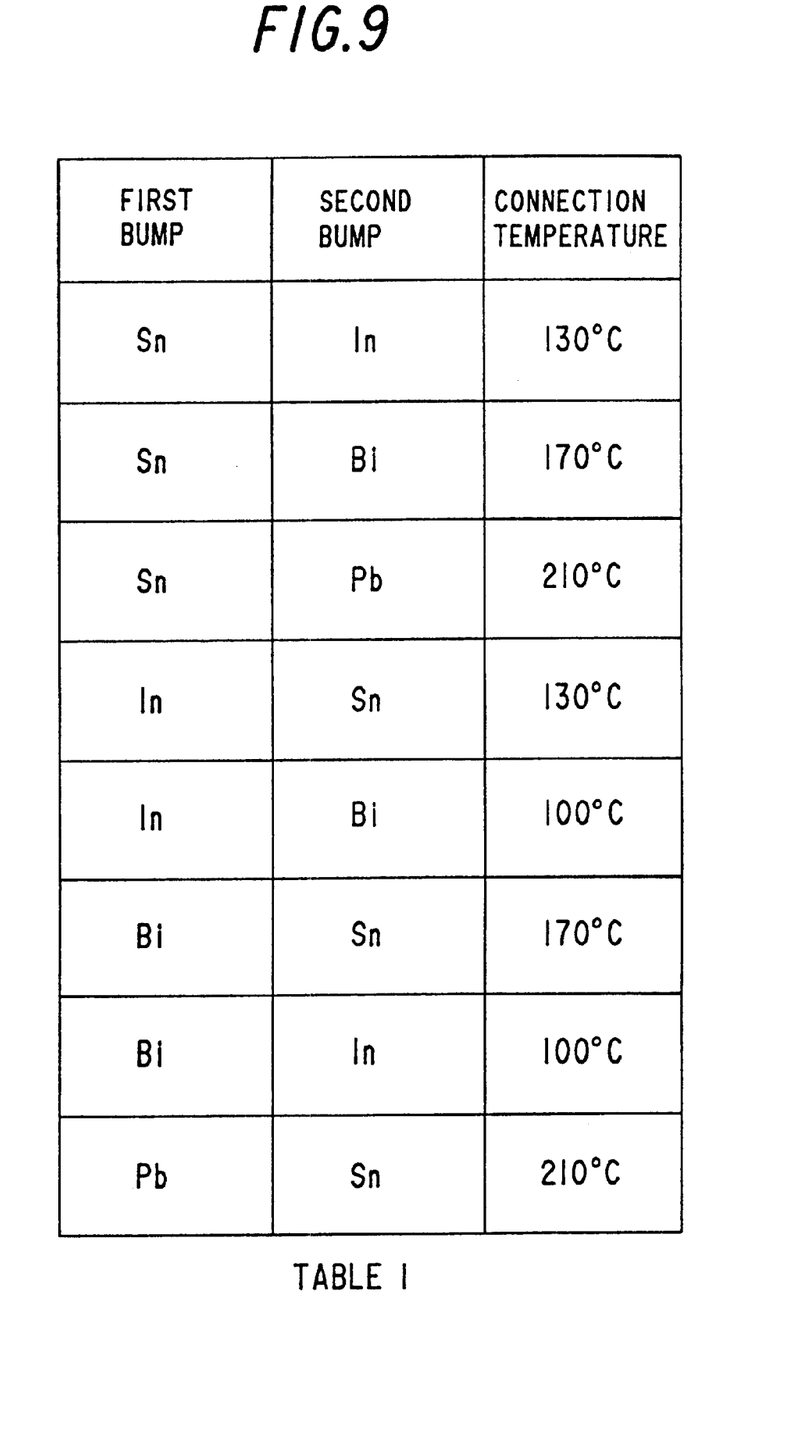

For higher integration of semiconductor chips on a circuit board, a flip-chip method has been developed which enables bare semiconductor chips to be mounted directly on a circuit board by connecting each of electrodes between the semiconductor chips and the circuit board using soldering metal. However, a drawback on a soldering metal connection is a fact that a surface of an aluminium interconnection layer, widely used in LSI circuit, has repellency against melt of soldering metal, which is often called a wettability problem. It could be avoided by coating the aluminium surface by a metal having an adhesive tendency to soldering metal, but it eventually makes the fabricating steps more complex. Another unfavorable effect of a soldering metal connection is that as shown in FIG. 7, a rigid connection between electrodes 32, 34 by soldering metal 33 often results in a crack 36 due to a repetitive local stress concentration caused by discrepancy in thermal expansion coefficient between a semiconductor chip and a circuit board. To avoid these foregoing problems, as shown in FIG. 8A, a bump 55 containing dispersed liquid metal particles 53 of indium-gallium in flux vehicle 54 for a liquid connection on a gold electrode 52 has been proposed, however, surface tension of the liquid metal 53 against gold surface is still so high that the liquid metal often makes itself droplets 53 on the gold electrode 52 after heating process as shown in FIG. 8B.

SUMMARY OF INVENTION

It is an object of the present invention to provide a method for fabricating an integrated electronic device having a soldering metal connection between a semiconductor chip and a circuit board free from the wettability problem on the soldering metal connection to an electrode of the semiconductor chip.

It is another object of the present invention to provide a method for fabricating an integrated electronic device having a soldering metal connection between a semiconductor chip and a circuit board free from disconnection failures caused by thermal stress.

It is a further object of the present invention to provide an integrated electronic device having a soldering metal connection between a semiconductor chip and a circuit board free from the wettability problem on the soldering metal connection to an electrode of the semiconductor chip.

It is a still further object of the present invention to provide an integrated electronic device having a soldering metal connection between a semiconductor chip and a circuit board free from disconnection failures caused by thermal stress.

One aspect of the present invention is a method for fabricating an integrated electronic device having an electric connection between a first electrode of a semiconductor chip and a second electrode of a circuit board comprising the steps of:
  forming a first bump made of a first metal component on the first electrode, a surface of the first electrode having repellency against melt of the first metal component;
  forming a second bump made of a second metal component on the second electrode opposite to the first bump in a position; and
  forming a connection part made of an eutectic alloy consisting of the first metal component and the second metal component between the first bump and the second bump so as to make an electric connection between the first electrode and the second electrode.

Another aspect of the present invention is a method for fabricating an integrated electronic device having an electric connection connecting a first electrode of a first substrate with a second electrode of a second substrate, both surfaces of the first and second electrodes having an adhesive tendency to molten metal, the method comprising the steps of:
  forming a metal bump on the surface of the first electrode, the metal bump being made of a soldering metal alloy consisting of a solid phase component and a liquid phase component at an operating temperature; and
  forming an electric connection between the first electrode and the second electrode by heating the soldering metal alloy so as to adhere to the surface of the second electrode.

Still another aspect of the present invention is a method for fabricating an integrated electronic device having an electric connection between a first electrode of a first substrate and a second electrode of a second substrate comprising the steps of:
  forming a first metal layer on a surface of a first electrode on a first substrate, the first metal layer capable of composing an eutectic alloy with gallium (Ga);
  forming a bump of Ga-rosin mixture on the first metal layer selectively; and
  forming the electric connection between the first electrode and the second electrode by heating the bump of Ga-rosin mixture maintaining the bump of the Ga-rosin mixture in contact with the second electrode to react gallium in the Ga-rosin mixture with the first metal layer into the alloy capable to adhere to the first and second electrodes.

The technique according to the present invention can be applied to an electromechanical device such as a saw-tooth device or an optoelectronic device as well as a multi-chip semiconductor module having a multi-layered circuit board.

BRIEF DESCRIPTION OF DRAWINGS

Preferred embodiments of the invention are described with reference to the accompanying drawings, in which.

TABLE 1 is examples setting forth combination of the first and second bump metals and their connection temperatures.

DESCRIPTION OF THE PREFERRED EMBODIMENTS

Figure 1A:
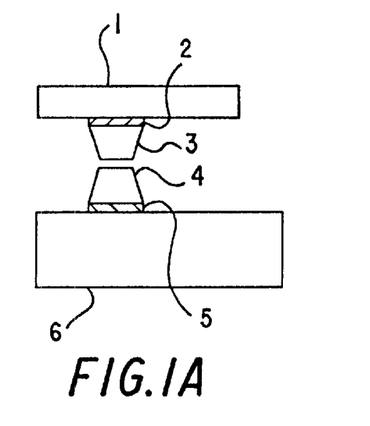
FIG. 1A is a diagrammatic section view of a pair of soldering metal bumps on a chip and a circuit board before connecting to each other related to the first embodiment.

Referring to FIG. 1A, a semiconductor chip 1 has an electrode pad 2 of aluminium which has repellency against molten metal. Titanium, chromium or alloys of aluminum, chromium or titanium are other suitable materials for electrode pad 2. The first soldering metal bump 3 made of the first metal component is formed on the electrode pad 2, while a circuit board 6 has an electrode pad 5 of copper which has adhesive tendency to molten metal. The second soldering metal bump 4 made of the second metal component is formed on the electrode pad 5. These metal components are capable to compose an eutectic alloy having a specific compound ratio, and that a melting temperature of the first metal component is higher than a contact temperature of the second metal component. The contact temperature is a process temperature to form an alloy between two metal components.

Figure 1B:
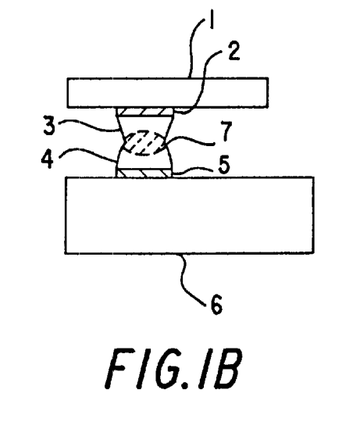
FIG. 1B is a diagrammatic section view of a pair of soldering metal bumps on a chip and a circuit board after connecting to each other related to the first embodiment.

Referring to FIG. 1B, a connection part made of an eutectic alloy consisting of the first metal component and the second metal component is formed between the first soldering metal bump and the second soldering metal bump by heating the both soldering metal bumps at a temperature lower than the melting temperature of the first metal component to maintain the first soldering metal bump in a solid phase at an interface with the aluminium electrode and then cooling down to solidify both of the bumps before the eutectic reaction reaches the aluminium electrode pad 2, in order to prevent the aluminium electrode pad from repelling the first soldering metal bump.

Figure 2A:
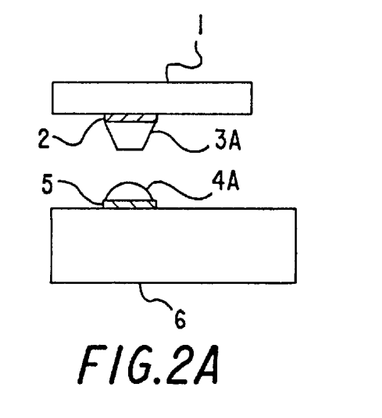
FIG. 2A is a diagrammatic section view of a pair of soldering metal bumps on a chip and a circuit board before connecting to each other related to the second embodiment.

Referring to FIG. 2A, a semiconductor chip 1 has an electrode pad 2 of aluminium has repellency against molten metal. The first soldering metal bump 3A is formed on the electrode pad 2 in a trapezoidal shape by deposition technique using a mask having an opening with the same pattern as the first electrode pad, while a circuit board 6 has an electrode pad 5 of copper has adhesive tendency to molten metal. The second soldering metal bump 4A is formed on the electrode pad 5. A melting temperature of the first soldering metal bump is higher than that of the second soldering metal bump.

Figure 2B:
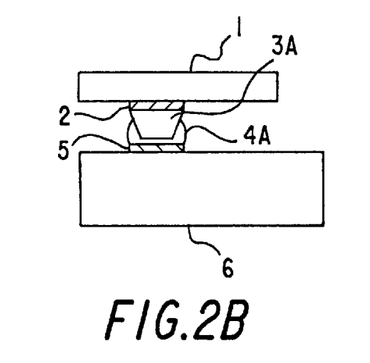
FIG. 2B is a diagrammatic section view of a pair of soldering metal bumps on a chip and a circuit board after connecting to each other related to the second embodiment.

Referring to FIG. 2B, electric connection between the electrode pad 2 and the electrode pad 5 is made by heating the both soldering metal bumps in contact to each other at a temperature lower than the melting temperature of the first metal bump to melt the second soldering metal bump 4A without melting the first soldering metal bump 3A and then cooling down to solidify the second soldering metal bump. The soldering metal is not limited to an eutectic alloy in this embodiment. Preferred mixing ratios for the first and second soldering metal bumps are Pb-5%(wt) Sn and Pb-65%(wt) Sn in weight, respectively. The melting temperatures of the first and second metal bumps are 315° C. for Pb-5%(wt) Sn and 185° C. for Pb-65%(wt) Sn, respectively. In this particular example, a preferred processing temperature to melt the second soldering metal bump is 200–230° C. Since the first soldering metal bump is not melted in this process, the trapezoidal shape on the electrode pad 2 is maintained after the electric connection is accomplished.

The electric connection implemented in the first and second embodiments described above does not have disconnection failure due to repellency of molten soldering metal by the electrode surface in the fabrication process. That reduces electric resistance and increases mechanical strength of the connection.

Figure 3:
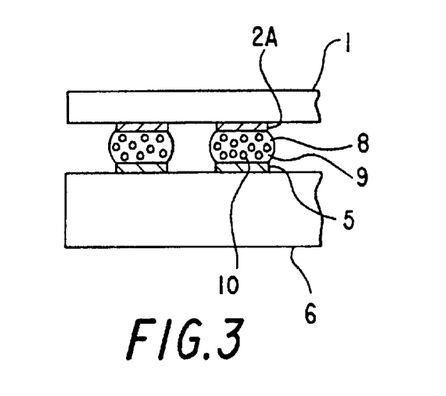
FIG. 3 is a diagrammatic section view of a solid-liquid soldering metal connection between a chip and a circuit board related to the third embodiment.

Referring to FIG. 3, an electrode 2A on a semiconductor chip 1 and an electrode 5 on a circuit board 6 are connected to each other by solid-liquid soldering metal 8. The surfaces of both electrodes have adhesive tendency to molten soldering metal. The solid-liquid soldering metal 8 consists of a solid phase component 10 and a liquid phase component 9 at an operating temperature. The operating temperature is a temperature of an integrated electronic device when the device is active in a normal condition. The eutectic reaction will take place in the solid-liquid soldering metal, where the solid and liquid phases are in thermal equilibrium to each other at a solid-liquid interface. For instance, at a sufficiently low temperature when the integrated circuit device is not operated, the solid-liquid soldering metal is solely composed of a solid phase matrix, and as temperature elevates by device operation, a liquid phase component grows in the solid phase matrix. At further higher temperature, a solid phase component 10 is dispersed in a liquid phase matrix 9 as illustrated in FIG. 3. This mechanism releases the soldering metal from a thermal stress, which prevents from disconnection between the electrodes.

Figure 4A:
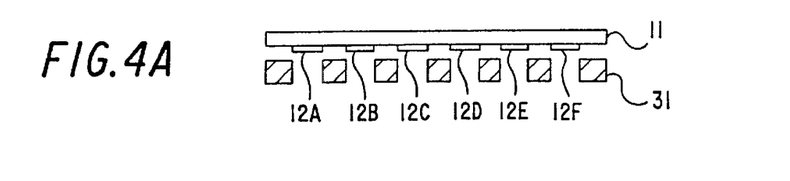
FIGS. 4A–4E are diagrammatic section views of an eutectic alloy connection between a chip and a circuit board in various processing steps related to the first embodiment.
Figure 4B:
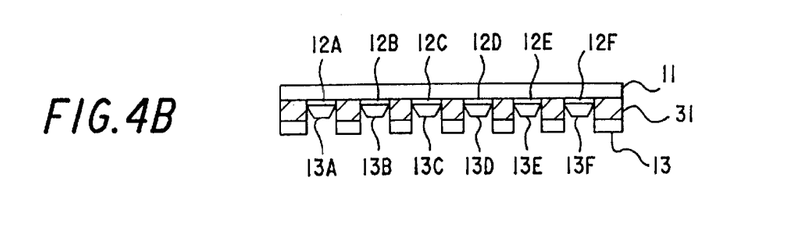
Figure 4C:
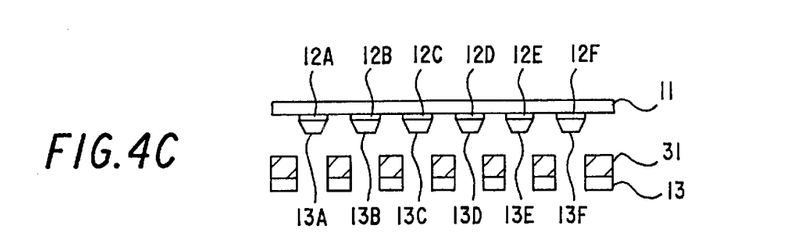
Figure 4D:
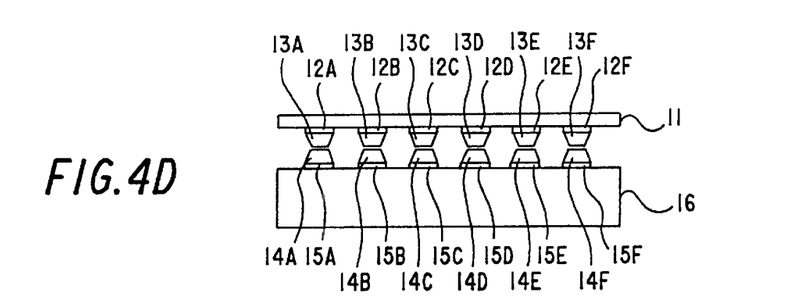
Figure 4E:
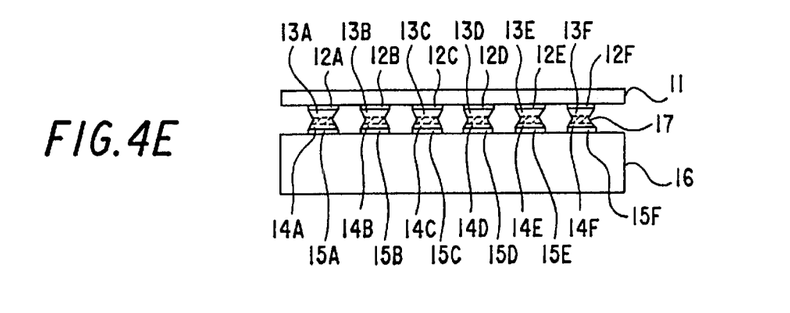

Such a process is more particularly described with reference to FIGS. 4A–4E, where a semiconductor chip 11 has an array of electrodes 12A–12F on the surface. FIG. 4A shows that a metal mask 31 having windows was aligned to the semiconductor chip 11 so as to expose each of aluminium electrodes 12A–12F on the semiconductor chip within each of the windows. As shown in FIG. 4B, the first bumps of 100 µm thick indium (In) layer 13A–13F were deposited on the aluminium electrodes through the windows pressing the mask 31 against the surface of the semiconductor chip 11. As shown in FIG. 4C, the In-bumps 13A–13F were exposed by removing the metal mask 31 on which In layer 13 was deposited. FIG. 4D shows that the second bumps of 100 µm thick tin (Sn) layer 14A–14F were formed on copper electrodes 15A–15F of a circuit board 16 by depositing tin through a metal mask. The first and second bumps were aligned to each other as shown in FIG. 4D, then kept contact to each other and heated at a connection temperature which was lower than a melting temperature of indium 156.6° C.

and higher than an eutectic temperature of In—Sn alloy 117° C., such as 130° C., the connection temperature is a processing temperature at which the first and second metal components make an alloy at an interface which provides an electric and mechanical connection, so that a connection part made of an eutectic alloy 17 was formed between the first and second bumps as in FIG. 4E. Since the connection temperature was sufficiently lower than the melting temperature of indium in this process, a molten metal was so localized to the connection part 17 that the aluminium electrode maintained a wide contact area with the first bump, which resulted in low contact resistance free from the repellency problem. Some of the preferred combinations of metals for the first and second bumps, and the connection temperature are shown in Table 1.

Figure 5A:
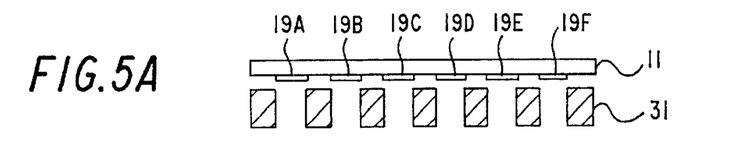
FIGS. 5A–5E are diagrammatic section views of a solid-liquid soldering metal connection between a chip and a circuit board in various processing steps related to the third embodiment.
Figure 5B:
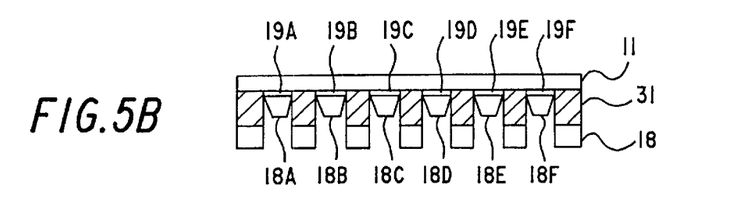
Figure 5C:
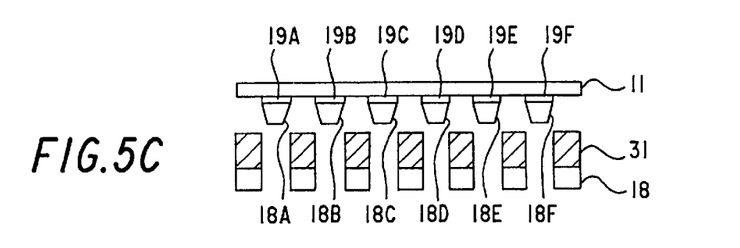
Figure 5D:
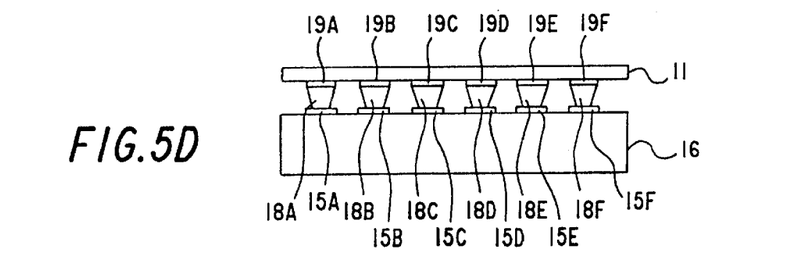
Figure 5E:
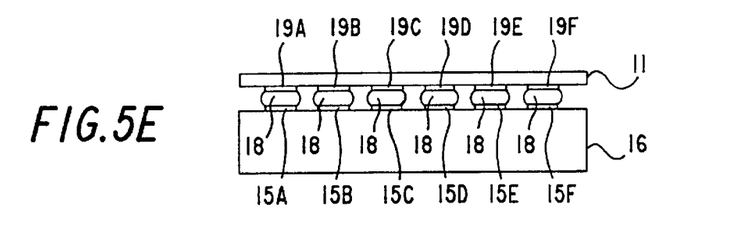

Referring to FIGS. 5A–5E, both first electrode pads 19A–19F on a semiconductor chip 11 and the second electrode pads 15A–15F on a ceramic circuit board 16 have an adhesive tendency to molten metal. Each of the first electrode pads 19A–19F was coated by about 0.3 μm thick film of gold, silver, or nickel. Subsequently, about 30 μm high soldering metal bumps 18A–18F consisting of indium (In) and 20%(wt) bismuth (Bi), namely In-20%(wt) Bi, were formed on the first electrode pads 19A–19F by depositing the soldering metals through a mask 31 as shown in FIGS. 5A–5C, similarly to FIGS. 4A–4C. As shown in FIGS. 5D–5E, the semiconductor chip 11 was firmly mounted on the ceramic circuit board 16 by melting at a temperature of about 300° C. and then solidifying the soldering metal bumps into each connection part 18 which connected each of the first electrode pads 19A–19F with each of the second electrode pads 15A–15F.

The connection part 18 shown in FIG. 5E made of In-20%(wt)Bi soldering metal which was deviated in composition ratio by 14%(wt) on Indium side from the In—Bi eutectic alloy having a composition ratio of In:Bi=66:34 in weight. Since the eutectic temperature was 72° C., the In-20%(wt)Bi soldering metal consisted of a solid phase component and a liquid phase component above the eutectic temperature. Therefore, a liquid phase component coexisted with a solid phase component in the connection part 18 between 75° C.–85° C. in the overall operating temperature range from 5° C. to 85° C. of the semiconductor chip. The mechanism that a liquid phase component increases with temperature releases a thermal stress in the connection part 18 caused by a difference in thermal coefficient between the semiconductor chip and the circuit board, and furthermore prevents metal fatigue that would be accumulated in the connection part 18 due to thermal hysteresis. Comparative study of experiments shows that no crack failure was observed in an integrated electronic device according to this embodiment after more than 100 cycles of thermal hysteresis in the operating temperature range from 5° C. to 85° C., while a crack was observed in a solid soldering metal of a prior art after 50 cycles of the same thermal hysteresis in avarage.

The foregoing connection part having solid-liquid phase coexistence in an operating temperature range can be implemented by a soldering metal alloy of various mixing ratios. A soldering metal alloy of the first type is essentially made of an eutectic alloy but has an additional minor component that is harmless for the soldering metal alloy to have the liquid phase component at an operating temperature of the integrated electronic device. The additional minor component gives the eutectic alloy phase separation in an upper part of the operating temperature range, such as an In—Bi eutectic alloy with a minor component of 2–3%(wt) Pb or Ge. A soldering metal of the second type is a soldering metal alloy which consists of the same metal components as those of an eutectic alloy and that the mixing ratio is slightly deviated from that of the eutectic alloy. Some of the eutectic alloys are a tertiary or four-element alloy such as Sn—Bi—In soldering metal based on an eutectic alloy of Sn:Bi:In=16.5:32.5:51 (wt %) with an eutectic temperature of 60° C., Sn—Pb—Bi—In soldering metal based on an eutectic alloy of Sn:Pb:Bi:In=19:17:53.5:10.5 (wt %) with an eutectic temperature of 60° C., and Sn—Pb—Bi—In soldering metal based on an eutectic alloy of Sn:Pb:Bi:Cd=13.3:26.7:50:10 (wt %) with an eutectic temperature of 50° C.

Figure 6A:
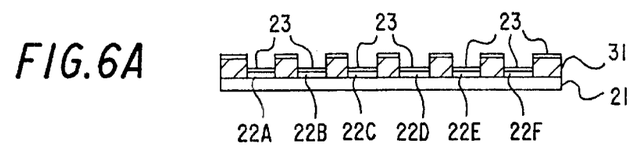
FIGS. 6A–6F are diagrammatic section views of a liquid metal connection between a chip and a circuit board in various processing steps related to the fourth embodiment.
Figure 6B:
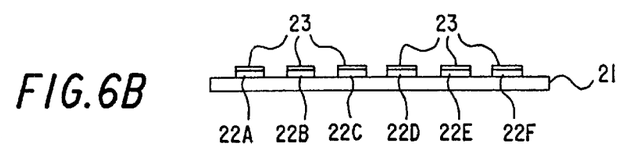
Figure 6C:
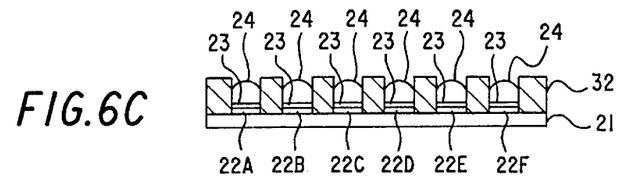
Figure 6D:
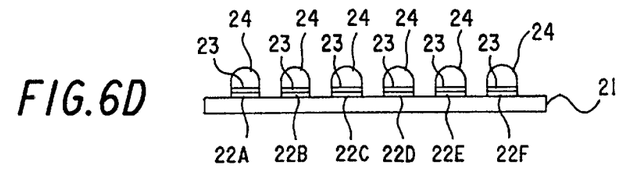
Figure 6E:
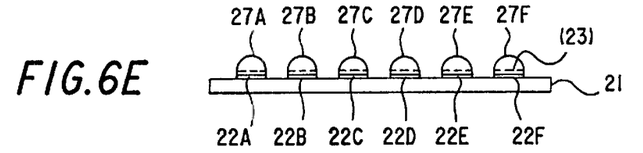
Figure 6F:
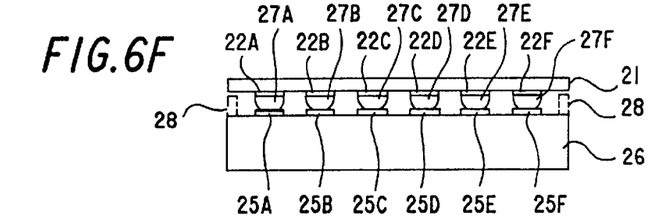

Referring to FIGS. 6A–6F, processing steps for fabrication of an integrated electronic device having electric connection made of In—Ga liquid metal between a semiconductor chip and a circuit board are described. Ga-rosin mixture was prepared before fabrication of the liquid In—Ga electric connection, for which Ga was mixed with a flux vehicle at mixing ratio of 9 to 1 in weight. After the Ga mixed flux vehicle was heated at 40° C. to melt Ga in it, it was stirred until fine Ga droplets of about 20–30 μm diameter were dispersed homogeneously in the flux vehicle. The flux vehicle was monobutylcarbithol including 60% rosin, 2% thichener, 0.5 activator (hydrochloric diethylamine). The semiconductor chip 21 shown up-side down in FIG. 6A, has an array of electrodes 22A–22F on a surface of the semiconductor chip. The first metal mask 31 made of covar was pressed tightly to the surface of the semiconductor chip so that an exposed area of the surface was masked. A 10 μm thick indium (In) film 23 was deposited on the entire surface of the semiconductor chip by evaporation technique. As shown in FIG. 6B, an array of In-coated electrodes was obtained by removing the first metal mask 31. As shown in FIG. 6C, a 200–300 μm thick Ga-rosin mixture 24 was selectively squeezed into each of windows of the second metal mask 32 having a thickness of 200–300 μm by a squeezer just as used in a printing technique. After removing the second metal mask 32 left a bump of Ga-rosin mixture 24 on the In-film 23, the semiconductor chip was heated at 200° C. so that Ga in the Ga-rosin mixture 24 and the underlayered In-film 23 were united to each other by eutectic reaction and vaporizing organic components as shown in FIG. 6D. 100 μm high In—Ga liquid connections 27A–27F made of an eutectic alloy between Ga and In were formed on each of the array of the electrodes 22A–22F shown in FIG. 6E. The eutectic reaction proceeded at the interface indicated by a dotted line 23 between In and Ga, which prevented the electrodes from repelling the liquid connection. As shown in FIG. 6F, the semiconductor chip 21 having an array of the liquid connections 27A–27F was mounted on a circuit board 26 having an array of electrodes 25A–25F by flipping the semiconductor chip 21 so that the liquid connection of the semiconductor chip and the electrode on the circuit board was aligned to each other with a certain height by maintaining a certain distance between the semiconductor chip and the circuit board by a spacer 28. The appropriate height of the liquid connection was 100 μm. In the foregoing embodiment, the surface of the electrode has such a good adhesive tendency to a liquid connection that the entire surface of the electrode is covered with the liquid metal, which eventually reduces the electric resistance of the connection. Indium of then eutectic alloy is replaceable by tin (Sn), silver (Ag) or zinc (Zn).

What is claimed is:

1. An integrated electronic device comprising:
    a first substrate having a first electrode formed on a first surface of the first substrate;

a second substrate having a second electrode formed on a first surface of the second substrate, the second substrate opposing to the first substrate so that the second electrode is aligned to the first electrode; and an electronic connection connecting the first electrode with the second electrode, the electronic connection consisting of first, second, and third solder regions arranged in series between the first and second electrodes such that the first region is electrically connected with the first electrode and the second region while the third region is electrically connected with the second electrode and the second region, wherein the first and second electrodes are made of different materials from each other.

2. The integrated electronic device according to claim 1, wherein three solder regions are characterized by three different melting temperatures from one another.

3. The integrated electronic device according to claim 1, wherein each of the solder regions has a different solder composition from one another.

4. The integrated electronic device according to claim 2, wherein the second solder region has a melting temperature lower than both melting temperatures of the first and third solder regions.

5. The integrated electronic device according to claim 3, wherein the second solder region is made of an eutectic alloy consisting of solder metal components of the first and third solder regions.

6. The integrated electronic device according to claim 1, wherein the first and second electrodes are repellent and adhesive to molten solder, respectively.

7. The integrated electronic device according to claim 1, wherein a melting temperature of the second solder region is lower than a maximum operating temperature of the integrated electronic device while at least a melting temperature of the first solder region is higher than the maximum operating temperature of the integrated electronic device.

8. An integrated electronic device according to claim 6, wherein a melting temperature of the first solder region is higher than a melting temperature of the third solder region.

9. An integrated electronic device according to claim 3, wherein the second solder region consists of compositions of the first and third solder regions.

* * * * *